May 21, 1963 I. M. MACKINTOSH 3,090,873

INTEGRATED SEMICONDUCTOR SWITCHING DEVICE

Filed June 21, 1960

INVENTOR
I. M. MACKINTOSH
BY H. W. Lockhart
ATTORNEY 3,090,873
Patented May 21, 1963

3,090,873

INTEGRATED SEMICONDUCTOR SWITCHING DEVICE

Ian M. Mackintosh, Stirling, N.J., assignor to Bell Telephone Laboratories, Incorporated, New York, N.Y., a corporation of New York Filed June 21, 1960, Ser. No. 37,738
6 Claims. (Cl. 307—88.5)

Figure 1:
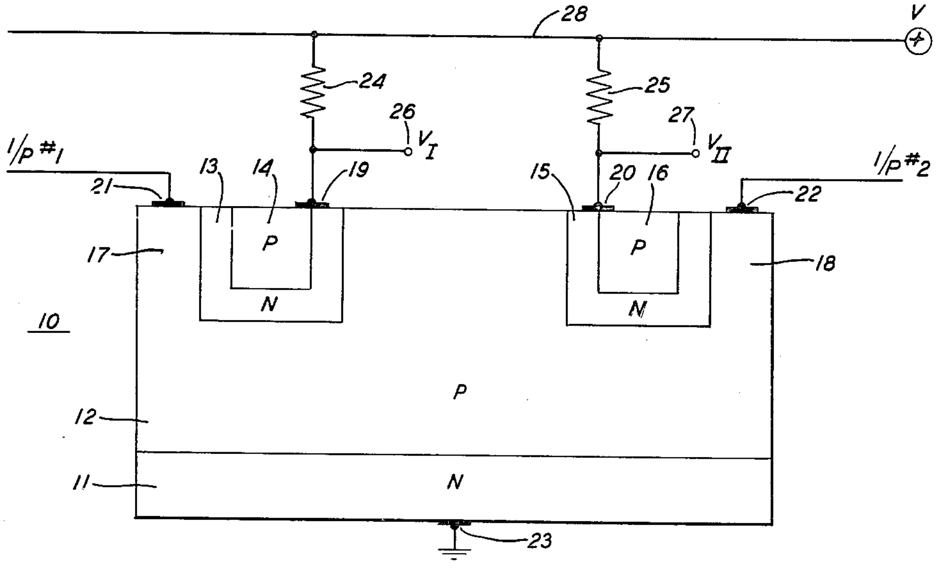

This invention relates to semiconductor pulse generators, and, more particularly, to a bistable multivibrator having two outputs and including an integrated semiconductor element.

Broadly, an object of this invention is an improved semiconductor pulse generator. More specifically, an object is a bistable multivibrator of greater utility, compactness and ease of fabrication.

Basically, an embodiment of this invention comprises a single semiconductor wafer having two portions each including a PNPN arrangement of conductivity-type zones. One terminal conductivity-type zone and the contiguous intermediate zone are coextensive with the entire lateral area of the wafer. The other P and N-type zones are distinct to each portion and contiguous with only a limited portion of the adjoining zones. Included within each of the two portions is an NPN arrangement as well as a PNPN. An output electrode is connected in common to each pair of distinct P and N-type zones. Input electrodes are attached at opposite extremities of the intermediate zone coextensive with the wafer area and a single terminal electrode is attached to the coextensive zone.

A voltage source is provided for maintaining across the semiconductor body a voltage which is less than the characteristic breakdown voltage of the PNPN and NPN elements in the absence of any application of power to the intermediate zone input electrodes. Typically, this maintained voltage is applied through resistance elements in series with the successive conductivity-type zones included in the two portions of the body. Terminals are connected at a point between the resistance elements and the output electrodes for detecting an output voltage characteristic which alternates between the high and low impedance condition in complementary fashion with respect to the two output terminals. This flip-flop characteristic results from the application of successive trigger pulses of the same polarity to the input electrodes. Thus, as a pulse is applied to either input electrode, the output voltage characteristics at both terminals each transfer to the opposite condition.

A feature of this invention, therefore, is a semiconductor element including six separate conductivity-type zones and five electrodes for producing a two-input, two-output bistable multivibrator.

Figure 2:
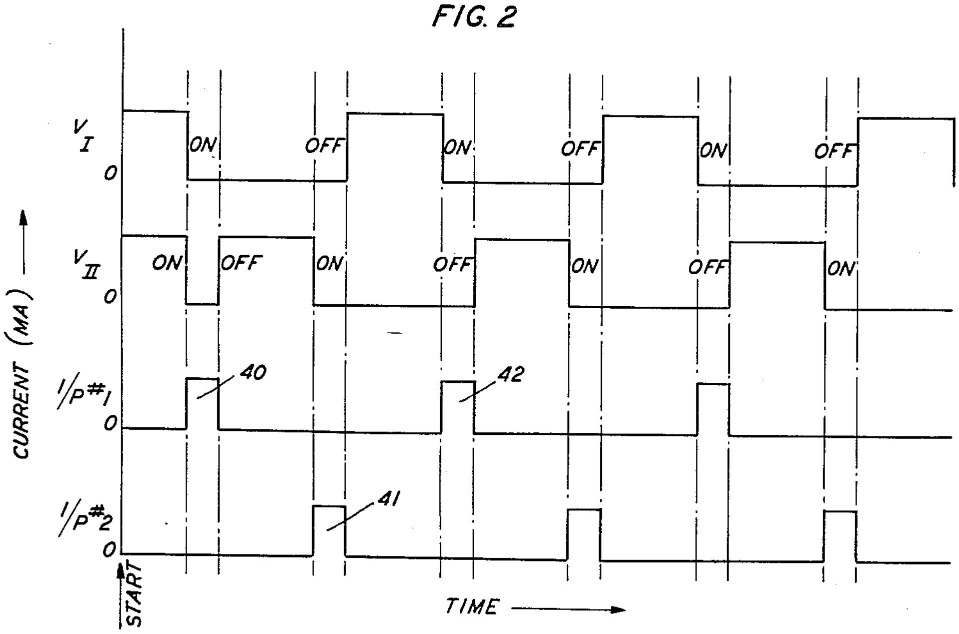

The invention and its further objects and features will be more clearly understood from the following detailed explanation taken in connection with the drawing in which:

FIG. 1 is a cross section taken lengthwise through the center of a wafer illustrating one embodiment of the invention; and FIG. 2 is a graph illustrating the pulse gênerating characteristics of the device.

In the embodiment of FIG. 1, the element 10 comprises a single crystal silicon semiconductor body having a terminal zone 11 of N-type conductivity, an intermediate zone 12 of P-type conductivity, both zones extending across the cross section of the entire body. Contiguous with only a limited portion of the P-type zone 12 are N-type intermediate zones 13 and 15 at the left-hand and the right-hand portions, respectively, of the body. Terminal P-type conductivity zones 14 and 16 are contiguous, in turn, with a limited portion of the N-type zones 13 and 15, respectively. Advantageously, zones 13, 14, 15 and 16 extend completely across the body in the dimension perpendicular to the plane of the drawing.

The semiconductor element is provided with five low resistance electrodes. The electrode 19 is attached to both P-type zone 14 and N-type zone 13 and the electrode 20 similarly is attached to both P-type zone 16 and N-type zone 15. These are designated output electrodes. At the extreme left hand portion 17 of the intermediate P-type zone 12 there is attached one input electrode 21 and at the extreme right-hand portion 18 there is attached a second input electrode 22. Finally, the N-type terminal zone 11 is connected to ground by way of electrode 23.

The various dimensions of the body are such that the zones 11, 12, 13 and 14 and the electrodes 19, 21 and 23 form a regenerative triode switch of the kind now described either as a controlled rectifier or thyristor. Similarly, the zones 11, 12, 15 and 16, electrodes 20, 22 and 23 form another regenerative triode switch. Additionally, zones 11, 12 and 13 together with electrodes 19, 21 and 23 and zones 11, 12 and 15 with electrodes 20, 22 and 23 form separate junction transistors. The lateral or sheet resistance of zone 12 is made sufficiently high to provide a degree of isolation between the two transistors.

A direct-current bias voltage is applied from the line 28 through resistance elements 24 and 25 to the electrodes 19 and 20. The terminals 26 and 27, designated $V_I$ and $V_{II}$, respectively, provide means for detecting the output signal of the device. In operation the device is similar in certain respects to the device disclosed in application Serial No. 37,739, filed concurrently with this application. The direct-current voltage maintained across the entire body is less than the characteristic breakdown voltage of either the PNPN or NPN portions in the absence of a triggering voltage on either one of the input electrodes 21 or 22.

Assuming, first of all, no conduction in any portion of the body 10 and, on both input terminals, a bias voltage typically about 0.5 volt, which is less than the triggering voltage required to turn the device "on," then upon application of a positive trigger voltage pulse of sufficient amplitude on input terminal #1 (electrode 21), the left-hand PNPN portion of the body will turn "on" and will remain in the low impedance or conducting condition. The voltage at output terminal $V_I$ then will drop from a value near the bias voltage to a relatively low value, as represented by the portion labeled "on" at the left-hand end of the $V_I$ graph.

Prior to the application of the trigger voltage pulse at terminal #1, the voltage $V_{II}$ observed at terminal 27 is high, also substantially the bias voltage, because there is no conduction through the right-hand portion of the body. When the trigger pulse is applied at terminal #1, in addition to turning the left-hand PNPN on, it will induce conduction through the NPN transistor of the right-hand portion of the body since this is the part of the right-hand portion closest to input terminal #1. That is, the NP junction common to N zone 11 and P zone 12 will emit current carriers which flow by the most direct path to the portion of electrode 20 which is connected to N zone 15. During the application of a trigger pulse at terminal #1, this NPN section goes into the saturation condition. However, the three-zone configuration is not regenerative and upon removal of the trigger pulse, conduction ceases in the right-hand portion. As a consequence, the output signal voltage $V_{II}$ rises again to a value substantially the same as the maintained voltage, as indicated by the portion of the $V_{II}$ graph labeled "off" corresponding to the termination of the trigger pulse on input #1.

If now a positive pulse 41 is applied at input terminal #2 (electrode 22), the carrier emission will be shifted to the right and, in the left-hand portion, will tend to occur directly from the junction 11—12 through zone 12 and zone 13 directly to the portion of electrode 19 attached to zone 13. This will take current away from the PNPN which will then turn "off."

At the same time, the pulse 41 on input terminal #2 will turn the right-hand PNPN element "on" into the conducting condition. At the termination of the pulse the left-hand NPN turns "off" so that output voltage $V_I$ rises again at the end of the pulse to a value near the maintained voltage and, since the right-hand portion has been turned "on," the output voltage $V_{II}$ drops to a low value.

With the application of another positive pulse 42 on input terminal #1, the element reverses the foregoing described procedure and the left-hand portion turns "on" and the right-hand portion turns "off." Thus, the outputs at the two terminals 26 and 27 are of the form typical of a flip-flop and are opposite in sense. Obviously, the trigger pulses, as shown in the graph of FIG. 2, may be of much shorter duration and may be timed so as to produce equal "on" and "off" periods at each output terminal.

The semiconductor element, shown in FIG. 1, can be readily fabricated using known vapor solid diffusion methods. Typically, the element 10 is fabricated from a slice of silicon material which may yield a large number of such single elements. Such a slice is from one-quarter to one-half inch square and about 12 mils in thickness. Advantageously, the material is of N-type conductivity with a resistivity of about 0.04 ohm-centimeter.

In the first step of the process, boron is diffused into all surfaces of the slice to produce a P-type skin about 0.4 mil thick. The entire body then is oxidized and a photoresist pattern is developed on one polished face of the slice, which leaves exposed striplike areas corresponding to the surfaces of the N-type intermediate ones 13 and 15. Next, the slice is heat treated in a phosphorus atmosphere for a period sufficient to produce a diffusion depth of 0.25 mil. After cleaning, the body is again oxidized and another photoresist pattern is developed, which leaves exposed the surfaces corresponding to P-type terminal zones 14 and 16. The body is again subjected to a boron diffusion sufficient to produce P-type conductivity zones 0.15 mil deep. During these subsequent diffusion heat treatments, the first diffused P-type zone 12, which had an original depth of about 0.4 mil, will diffuse further into the body so as to have a final dimension of about 0.5 mil. The lower side of the slice then is etched and polished away to a total thickness of about 3.5 mils, so that the N-type terminal zone has a thickness of about 3 mils. Finally, the metallic electrodes are applied by vapor deposition through metal masks so as to deposit plated contacts of a standard gold-antimony alloy for the electrodes 19 and 20 and an aluminum alloy for the electrodes 21 and 22. The contact 23 to the N-type terminal zone 11 likewise is a gold-antimony alloy to provide good low resistance contact to N-type material. Next, the slice is cut apart by scribing and etching into separate elements of the type described in connection with FIG. 1. The various electrical leads are attached by well-known soldering techniques to the electrodes described above.

Typically, the PNPN elements have a breakdown voltage of about 30 volts. The resistance elements 24 and 25 may be resistors of about 1000 ohms so that for a maintained voltage across the body of ten volts, positive trigger pulses of appropriate amplitude, typically about one volt for from one nanosecond to one microsecond, will shift simultaneously the output signal on each of the terminals in a complementary fashion between a high and low level of voltage.

Although the invention has been described in terms of a particular embodiment, it will be understood that other arrangements may be devised by those skilled in the art which also will be within the scope and spirit of the invention. For example, it is apparent that the conductivity-type regions may be reversed within the device along with a reversal of the polarity of all of the applied voltages.

What is claimed is:

1. An integrated semiconductor switching device comprising a semiconductor body having two portions each including only four successive conductivity-type zones, only one terminal zone and the intermediate zone contiguous therewith being distinct to each said portion, first means for maintaining between each of the said one terminal zones and the other terminal zone and between said contiguous intermediate zones and the other terminal zone a voltage which is less than the characteristic breakdown voltage of the included portions of the semiconductor body in the absence of a trigger voltage pulse applied to the other intermediate zone, second and third means for applying trigger voltage pulses to portions of said other intermediate zone remote from each other, and separate means for detecting output signals across said two portions of said body.

2. An integrated semiconductor switching device comprising a semiconductor body including a first zone of one conductivity type, a second zone of opposite conductivity type defining a PN junction with the first zone, a first pair of spaced zones each of the one conductivity type and contiguous with a limited portion of the second zone and forming a separate PN junction with the second zone, a second pair of spaced zones each of the opposite conductivity type and contiguous with a limited portion of a different one of the zones of the first pair, said body having no other zones, means for maintaining between said first pair of spaced zones and said first zone and between said second pair of spaced zones and said first zone a voltage which is less than the characteristic breakdown voltage of the therebetween included zones in the absence of a trigger pulse applied to said second zone, separate voltage means for applying voltage pulses to portions of said second zone remote from each other, and means for detecting output signals between said first zone and said pairs of spaced zones respectively.

3. An integrated semiconductor switching device comprising a semiconductor body including a first zone of one conductivity type, a second zone of opposite conductivity type defining a PN junction with the first zone, a first pair of spaced zones each of the one conductivity type and contiguous with a limited portion of the second zone and forming a separate PN junction with the second zone, a second pair of spaced zones each of the opposite conductivity type and contiguous with a limited portion of a different one of the zones of the first pair, said body having no other zones, a low resistance connection to said first zone, a pair of low resistance connections to widely separated portions of said second zone and another pair of low resistance connections each common to one of said first pair and one of said second pair of zones, means for applying separate input trigger pulses to the low resistance connections to said second zone, means for maintaining a voltage across said connections to said pairs of zones and the connection to said first zone, said means including resistance means, and means for detecting an output signal between each of said low resistance connections to said pairs of zones and the connection to said first zone.

4. An integrated semiconductor switching device comprising a semiconductor body having two portions each including only four successive conductivity-type zones, only one terminal zone and the intermediate zone contiguous therewith being distinct to each said portion, first means for maintaining between each of the said one terminal zones and the other terminal zone a voltage which is less than the characteristic breakdown voltage of the included portions of the semiconductor body in the absence of a trigger voltage pulse applied to the other intermediate zone, said means including a pair of electrodes each connected in common to one terminal zone and to the intermediate zone contiguous therewith, second and third means for applying trigger voltage pulses to portions of said other intermediate zone remote from each other, said second and third means including electrodes connected at spaced-apart locations on said other intermediate zone, and terminal means for detecting separate output signals across said two portions of said body respectively.

5. An integrated semiconductor switching device comprising a semiconductor body including a first zone of one conductivity type, a second zone of opposite conductivity type defining a PN junction with the first zone, a first pair of spaced zones each of the one conductivity type and contiguous with a limited portion of the second zone and forming a separate PN junction with the second zone, a second pair of spaced zones each of the opposite conductivity type and contiguous with a limited portion of a different one of the zones of the first pair, said body having no other zones, a low resistance connection to said first zone, a pair of low resistance connections to widely separated portions of said second zone and another pair of low resistance connections each common to one of said first pair and one of said second pair of zones, means for applying separate input trigger pulses to the low resistance connections to said second zone, means for maintaining a voltage which is less than the characteristic breakdown voltage of the therebetween included zones in the absence of a trigger pulse applied to said second zone across said connections to said pairs of zones and the connection to said first zone, said means including resistance means, and means for detecting an output signal between each of said low resistance connections to said pairs of zones and the connection to said first zone.

6. An integrated semiconductor switching device comprising a silicon semiconductor body including a first zone of N-type conductivity, a second zone of P-type conductivity, a first pair of spaced zones each of N-type conductivity and contiguous with a limited portion of the second zone, a second pair of spaced zones each of P-type conductivity and contiguous with a limited portion of a different one of the zones of the first pair, said body having no other zones, a low resistance connection to said first zone, a pair of low resistance connections to widely separated portions of said second zone and another pair of low resistance connections each common to one of said first pair and one of said second pair of zones, means for applying separate input trigger pulses to the low resistance connections to said second zone, means for maintaining a voltage which is less than the characteristic breakdown voltage of the therebetween included zones in the absence of a trigger pulse applied to said second zone across said connections to said pairs of zones and the connection to said first zone, said means including resistance means, and means for detecting an output signal between each of said low resistance connections to said pairs of zones and the connection to said first zone.

References Cited in the file of this patent

UNITED STATES PATENTS

| | | |
|---|---|---|
| 2,655,609 | Shockley | Oct. 13, 1953 |
| 2,936,384 | White | May 10, 1960 |
| 2,967,952 | Shockley | Jan. 10, 1961 |

OTHER REFERENCES

"Applications and Circuit Design Notes," published by Solid States Products, Inc.

Bulletin D410–01, July 1959, pages 3 to 5 relied on.

Bulletin D410–02, October 1959, pages 3 relied on.